United States Patent [19]

Sakai

[11] Patent Number: 5,050,531
[45] Date of Patent: Sep. 24, 1991

[54] APPARATUS FOR PRODUCING AN IMAGE RECORDING MEDIUM

[75] Inventor: Jun Sakai, Nagoya, Japan

[73] Assignee: Brother Kogyo Kabushiki Kaisha, Aichi, Japan

[21] Appl. No.: 517,557

[22] Filed: Apr. 27, 1990

Related U.S. Application Data

[63] Continuation of Ser. No. 253,614, Oct. 5, 1988, abandoned.

[30] Foreign Application Priority Data

Oct. 9, 1987 [JP] Japan .................... 62-256003

[51] Int. Cl.$^5$ .............................................. B05B 5/25
[52] U.S. Cl. .................................... 118/621; 355/27; 118/638
[58] Field of Search ................ 118/60, 620, 621, 638; 355/290, 285, 295, 27, 106; 430/138

[56] References Cited

U.S. PATENT DOCUMENTS

| | | | |
|---|---|---|---|
| 3,667,742 | 6/1972 | Kamola | 263/6 E |
| 4,047,182 | 9/1977 | Faren | 343/904 |
| 4,369,729 | 1/1983 | Shigenobu et al. | 118/60 |
| 4,541,705 | 9/1985 | Knechtel | 355/3 F U |
| 4,563,086 | 1/1986 | Knapp et al. | 355/14 D |
| 4,647,182 | 3/1987 | Pierce | 355/4 |
| 4,647,182 | 3/1987 | Pierce | 355/4 |
| 4,696,561 | 9/1987 | Katoh | 355/295 |
| 4,801,949 | 1/1989 | Misono et al. | 346/76 |
| 4,801,949 | 1/1989 | Misono et al. | 346/76 L |
| 4,841,338 | 6/1989 | Suzuki | 355/27 |
| 4,841,338 | 6/1989 | Suzuki | 355/27 |

FOREIGN PATENT DOCUMENTS

| | | |
|---|---|---|
| 1169410 | 11/1969 | United Kingdom . |
| 1350946 | 4/1974 | United Kingdom . |
| 1378798 | 12/1974 | United Kingdom . |
| 1527168 | 10/1978 | United Kingdom . |
| 2055619 | 3/1981 | United Kingdom . |

OTHER PUBLICATIONS

"Neblette's Handbook of Photograph and Reprography", published 1977 by Van Nostrand, p. 369.

Primary Examiner—Bernard Nozick
Attorney, Agent, or Firm—Oliff & Berridge

[57] ABSTRACT

To produce an image recording medium having a support member and a developer material deposited thereon, the support member is charged to a first polarity and powders of a mixture of the developer material and a thermally fusible material both charged to a second polarity opposite to the first polarity are applied to the surface of the support member. Then, the developer material thereon is fixed to the support member by thermally fusing the thermally fusible material with the use of a fixing unit. The recording medium thus produced is used in conjunction with a microcapsule sheet to form an image on the recording medium. On the surface of the microcapsule sheet, photosensitive and pressure rupturable microcapsules are coated and a chromogenic material is encapsulated therein. The image is formed by the reaction of the chromogenic material with the developer material.

3 Claims, 1 Drawing Sheet

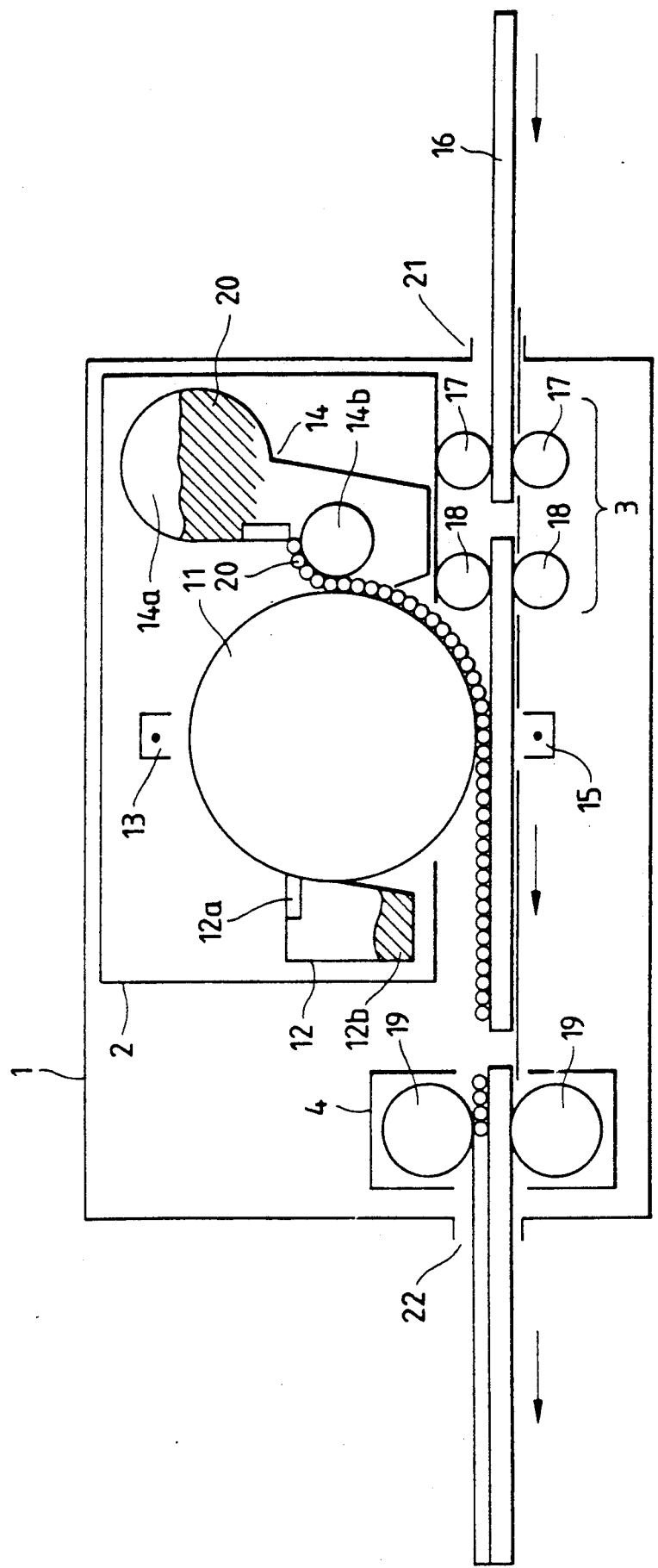

APPARATUS FOR PRODUCING AN IMAGE RECORDING MEDIUM

This is a continuation of application Ser. No. 07/253,614 filed Oct. 5, 1988 now abandoned.

BACKGROUND OF THE INVENTION

The present invention relates to an apparatus for producing an image recording medium and a method of producing the same.

Photosensitive pressure-sensitive recording mediums are generally used in recording apparatuses, which can be classified into two types, one of which is of a self-contained type and the other of which is of a transfer type. In the self-contained type, microcapsules encapsulating a chromogenic material and a developer material are co-deposited on one surface of a single substrate as one layer or as two continguous layers. In the transfer type, the developer material is coated on a separate substrate as a separate developer sheet. Recording methods using the transfer type recording mediums are disclosed in Japanese Patent Publication (Unexamined) Nos. 61-137749, 61-143738 and 61-173981. According to such conventional recording methods, a microcapsule sheet which carries microcapsules sensitive to light is exposed to an image-bearing light to form a latent image thereon, and is placed over the developer sheet and then a pressure-development is carried out. In the pressure-development, those microcapsules which have a lower mechanical strength are ruptured so that the chromogenic material flown out of the microcapsules reacts with the developer material to thereby form an image on the developer sheet. This developer sheet is produced from an apparatus owned by a paper manufacturer, in which the developer material is coated on the substrate using water or an organic solvent to diffuse the developer material.

However, the use of water or an organic solvent makes it difficult to maintain the apparatus. It is also difficult to uniformly diffuse the developer material even if water or the organic solvent is used. On the contrary, water, when used, requires time to be dried and the use of the organic solvent may generate a harmful gas.

In addition, the above-described conventional recording methods require the use of the developer sheet produced by the paper manufacturer and do not permit a user to form an image on a desired substrate. Therefore, there is a demand that the developer sheet producing apparatus be provided with which the developer sheet using a desired substrate can be produced.

SUMMARY OF THE INVENTION

Accordingly, it is an object of this invention to provide an image recording medium producing apparatus which overcomes the above problems and in which a desired support member is usable.

To achieve the above and other objects, according to one aspect of the invention, there is provided an image recording medium producing apparatus for producing an image recording medium having a support member and a developer material coated thereon, said apparatus comprising:

a first charging means for charging said developer material to a first polarity;

an applying means for applying said developer material charged to said first polarity onto said support member; and a fixing means for fixing said developer material to said support member.

According to another aspect of the invention, there is provided a method of producing an image recording medium having a support member and a developer material coated thereon, comprising the steps of:

(a) charging said developer material to a first polarity;

(b) applying said developer material charged to said first polarity onto said support member; and (c) fixing said developer material to said support member.

With the abovementioned apparatus and method, a developer material is electrostatically ahdered to the surface of the support member, and the adhered developer material is fixed on the support member by the fixing means.

BRIEF DESCRIPTION OF THE DRAWING

A single FIGURE is a schematic diagram illustrating an arrangement of an image recording medium producing apparatus according to one embodiment of this invention.

DETAILED DESCRIPTION OF THE PREFERRED EMBODIMENT

A preferred embodiment of this invention will be described with reference to the accompanying drawing.

Referring to a single figure, an image recording medium producing apparatus according to one embodiment of the invention is housed in a frame 1. The frame 1 has opposing side walls. The righthand side wall is provided with an insertion opening 21 through which a support member 16 is inserted, and a lefthand side wall is provided with a discharge opening 22 from which the support member 16 is discharged. Feed roller pairs 17 and 18 are disposed inside the frame 1 to feed the support member 16 inserted through the insertion opening 21 toward the discharge opening 22 along a travelling path of the support member 16.

Above the travelling path of the support member 16, a developer material transfer unit 2 is disposed. The unit 2 includes a drum 11 rotatable about its axis horizontally extending in a direction perpendicular to the travelling path. The drum 11 is disposed in such a manner that under the rotating state of the drum 11, the lowermost generating line of the drum 11 is in substantial contact with the upper surface of the support member 16 when the latter is positioned below the drum 11. A transfer corotron 15 is disposed immediately below the travelling path to confront the lowermost generating line of the drum 11 with the support member 16 intervening therebetween. Along the outer periphery of the drum 11, a cleaning unit 12, a charging corotoron 13, and a developer material supply unit 14 are disposed in the stated order in the rotational direction of the drum 11. The developer material supply unit 14 includes a reservoir 14a in which contained is a mixture of powders made up of a fine granular developer material 20 and a thermoplastic material. The developer material supply unit 14 further includes a sleeve 14b disposed in substantial contact with the outer periphery of the charging drum 11. The cleaning unit 12 includes a cleaning blade 12a and a powder collecting reservoir 12b. The powders 20 remaining on the surface of the drum 11 are scraped off by the cleaning blade 12a and are collected in the collecting reservoir 12b.

A fixing unit 4 is disposed downstream, with respect to the travelling direction of the support member 16, of the fixing unit 2 and includes a heat roller pair 19. The heat roller pair 19 is disposed in such a way that the support member 16 on which the powders are placed is allowed to pass into a nip therebetween.

An operation of the apparatus arranged as above will be described.

As the charging drum 11 rotates, the residual powders on the peripheral surface of the drum 11 are scraped by the cleaning blade 12a and collected in the collecting reservoir 12b. Then, the drum 11 is uniformly precharged to a polarity by the charging corotoron 13. The powders 20 in the reservoir 14a are charged to a polarity opposite to that on the surface of the drum 11, and the powders 20 are uniformly adhered to the surface of the drum 11 by means of the sleeve 14b.

The support member 16 inserted through the insertion opening 21 is transported by the feed roller pairs 17 and 18, and is charged to a polarity opposite to that of the powders 20 to an extent sufficient to separate the powders 20 from the drum 11. Accordingly, the powders 20 on the charging drum 11 are transferred onto the support member 16 at the lowermost generating line of the drum 11.

The support member 16 on which the powders 20 are placed is fed into the fixing unit 4 where the powders are thermally fixed to the support member 16 when passing through the nip between the thermal fixing rollers 19. Specifically, the thermoplastic material is fused when heated and is thereby rendered sticky to be adherable to the surface of the support member 16. In this manner, an image recording medium is produced and is discharged from the discharge opening 22.

The image recording medium obtained in accordance with the present invention is used in conjunction with a microcapsule sheet on the surface of which an encapsulated chromogenic material is coated. The microcapsule sheet is made up of a substrate or a support member made of resin and pressure rupturable microcapsules coated on one surface of the support member, each of the microcapsules separately containing photo-curable resin and one of primary color chromogenic materials or dye precursors, i.e. colors of cyan, magenta and yellow. In order to obtain a color copy, the microcapsule sheet is exposed to an image-bearing light to form a latent image thereon, and the image recording medium produced in accordance with the present invention is placed over the microcapsule sheet. Under this condition, both the image recording medium and the microcapsule sheet are fed into a pressure-developing unit where they are pressed agianst each other to develop the latent image under pressure. The pressure-development is performed in such a way that the microcapsules whose mechanical strength are weakened or are remained weakened as a result of the exposure are ruptured and the chromogenic material flown out of the microcapsules reacts with the developer material, thereby forming a visible color image on the image recording sheet produced in accordance with the present invention.

Although the invention has been described with reference to a specific embodiment, a variety of changes and modifications may be made without departing from the scope and spirit of the invention. For instance, the charging drum 11 may be removed from the transfer unit 2, in the case of which the support member 16 may be precharged by the charging corotron 13 and the powders may directly be adhered to the surface of the support member 16.

In lieu of the heat rollers 19, another heating means may be employed, such as a heating wire extending in the widthwise direction of the support member, an infrared ray lamp, a ceramic heater may replace the heat rollers 19 to thereby perform heat irradiation fixing. Alternatively, pressure rollers may be employed in lieu of the heat rollers 19 to thereby perform pressure fixing.

As can be seen from the foregoing, according to the invention, an image recording medium can easily be produced using a desired support member. Because no organic solvent is used in this invention, the maintenance of the apparatus is easy and an occurence of troubles is reduced.

What is claimed is:

1. An image recording medium producing apparatus for producing an image recording medium having a support member and a developer material coated thereon, said apparatus not including an exposure device, comprising:
    a housing including an inlet and an outlet;
    feed roller pairs for feeding a support member through said inlet to said outlet;
    a drum within the housing;
    first charging means, located at a position adjacent to the drum, for charging the drum to a first polarity;
    supplying means, located adjacent to the drum downstream from said first charging means, for supplying developer material onto the drum, said supplying means including a reservoir and a sleeve disposed in substantial contact with the outer periphery of the drum;
    second charging means, located adjacent to the drum downstream from said supplying means and downstream from said feed roller pairs, for charging said support member to a second polarity so that said developer material supplied to said drum is transferred from said drum to said support member; and
    fixing means, locating downstream from said second charging means, for fixing said developer material to said support member.

2. The apparatus according to claim 1, wherein a mixture of the developer material and a thermally fusible material is coated on said support member by said supplying means, and wherein said fixing means comprises a thermal fixing member for thermally fusing said thermally fusible material and fixing said developer material to said support member.

3. The apparatus according to claim 2, wherein said thermal fixing member is a roller rotatable about its axis and having a periphery which is in contact with said developer material and said thermally fusible material coated on said support member.

* * * * *